United States Patent
Rafailovich et al.

(10) Patent No.: US 9,401,489 B2
(45) Date of Patent: Jul. 26, 2016

(54) ATTACHMENT OF CONDUCTING GRAPHENE ELECTRODE LAYER TO AN ORGANIC POLYMER

(71) Applicant: The Research Foundation for The State University of New York, Albany, NY (US)

(72) Inventors: Miriam Rafailovich, Plainview, NY (US); Rebecca Isseroff, West Hempstead, NY (US); Andrew Chen, North Woodmere, NY (US); Sneha Chittabathini, Hicksville, NY (US); Alexandra Tse, North Woodmere, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 130 days.

(21) Appl. No.: 14/092,230

(22) Filed: Nov. 27, 2013

(65) Prior Publication Data

US 2014/0147602 A1 May 29, 2014

Related U.S. Application Data

(60) Provisional application No. 61/730,291, filed on Nov. 27, 2012.

(51) Int. Cl.
*B05D 3/06* (2006.01)
*H01L 51/44* (2006.01)
*H01L 51/42* (2006.01)

(52) U.S. Cl.
CPC ........... *H01L 51/441* (2013.01); *H01L 51/4253* (2013.01); *Y02E 10/549* (2013.01)

(58) Field of Classification Search
CPC ............. C08J 3/28; C08J 9/36; H01L 51/441; H01L 51/4253
See application file for complete search history.

(56) References Cited

U.S. PATENT DOCUMENTS

2009/0227755 A1* 9/2009 DeVoe et al. ................. 526/319

OTHER PUBLICATIONS

Gao et al; Anode modification of inverted polymer solar cells using graphene oxide; Applied Physics Letters, 97, 203306; Nov. 18, 2010.*
Zhang et al; High-conductivity graphene nanocomposite via facile, covalent linkage of gold nanoparticles to graphene oxide; Chinese Science Bulletin, vol. 57, No. 23: 3086-3092; Aug. 2012.*
Yang et al; Uniform Decoration of Reduced Graphene Oxide Sheets with Gold Nanoparticles; Journal of Nanotechnology, vol. 2012; Jan. 2012.*
Lee et al., "Flexible organic solar cells composed of P3HT:PCBM using chemically doped graphene electrodes," Nanotechnology 23 344013: 1-6 (2012).
Kim et al., "Photocrosslinkable Polythiophenes for Efficient, Thermally Stable, Organic Photovoltaics," Adv. Funct. Mater. 19: 2273-2281 (2009).
Xu et al., "Polymer photovoltaic devices with transparent graphene electrodes produced by spin-casting," Carbon 48: 3293-3311 (2010).
Lu et al., "Morphological Characterization of a Low-Bandgap Crystalline Polymer:PCBM Bulk Heterojunction Solar Cells," Adv. Energy Mater. XX: 1-9 (2011).
Jenna deBoisblanc, "Synthesis and Characterization of P3HT:PCBM Organic Solar Cells," Senior Thesis, pp. 1-44, May 4, 2010, Advisors: David Tanenbaum and Alma Zook.
Weihao Ge, "An overview on P3HT:PCBM, the most efficient organic solar cell material so far." Solid State Physics II, Spring 2009, Instructor: Elbio Dagatto, University of Tennessee.
Eda et al. "Chemically Derived Graphene Oxide: Towards Large-Area Thin-Film Electronics and Optoelectronics," Adv. Mater. 22: 2392-2415 (2010).
"Ultraviolet-Ozone Surface Treatment," Three Bond Technical News 17, Mar. 20, 1987.

* cited by examiner

*Primary Examiner* — Michael Wieczorek
(74) *Attorney, Agent, or Firm* — Hoffmann & Baron, LLP

(57) ABSTRACT

A method of attaching reduced graphene oxide and/or graphene oxide to a polymer layer that includes: forming a polymer layer having a hydrophobic, exterior surface; subjecting the hydrophobic, exterior surface of the polymer layer to ultraviolet/ozone (UV/O$_3$) exposure to change the hydrophobic, exterior surface to a hydrophilic, exterior surface; and applying reduced graphene oxide and/or graphene oxide to the hydrophilic surface of the polymer layer. The UV/O$_3$ exposure reduces the contact angle of droplets on the exterior surface of the polymer layer so that greater amounts of reduced graphene oxide and/or graphene oxide can be applied to the surface.

20 Claims, 3 Drawing Sheets

ATTACHMENT OF CONDUCTING GRAPHENE ELECTRODE LAYER TO AN ORGANIC POLYMER

This application claims priority based on U.S. provisional application No. 61/730,291 filed on Nov. 27, 2012.

FIELD OF THE INVENTION

The present invention is a method for attaching a conductive, graphene layer and or graphene oxide layer to an organic polymer. In particular, the present invention relates to flexible, plastic sheets with conductive, graphene layers that are used to form solar cells.

BACKGROUND OF INVENTION

A solar cell is any device that directly converts the energy in light (i.e., light energy or photons) into electrical energy through the process of photovoltaics, which is also referred to as the "photovoltaic effect." A photovoltaic module is a packaged, connected assembly of solar cells. A solar panel is a set of solar photovoltaic modules electrically connected and mounted on a supporting structure. The majority of solar modules use wafer-based crystalline silicon cells or thin-film cells based on cadmium telluride or silicon. Most solar modules are rigid, but semi-flexible ones are available, based on thin-film cells.

Currently, most commercial solar cells are made from a refined, highly purified silicon crystal, similar to the material used in the manufacture of integrated circuits and computer chips (wafer silicon). The high cost of these silicon solar cells and their complex production process has generated interest in developing alternative photovoltaic technologies such as polymer solar cells.

A polymer solar cell is a type of flexible solar cell made with polymer chains formed from large molecules with repeating structural units that produce electricity from sunlight by the photovoltaic effect. Polymer solar cells include organic solar cells (also called "plastic solar cells"). They are one type of thin film solar cell; others include the currently more stable amorphous silicon solar cell. Polymer solar cell technology is relatively new and is currently being very actively researched.

Compared to silicon-based devices, polymer solar cells are lightweight, potentially disposable and inexpensive to fabricate, flexible, customizable and they have lower potential for negative environmental impact. The major disadvantage of polymer solar cells is that they offer about ⅓ of the efficiency of hard materials. They are also relatively unstable toward photochemical degradation. For these reasons, despite continuing advances in semiconducting polymers, the vast majority of solar cells rely on inorganic materials.

Organic polymer solar cells ("OPSCs") differ from inorganic semiconductor solar cells in that they do not rely on the large built-in electric field of a PN junction (i.e., the boundary or interface between two types of semiconductor material) to separate the electrons and holes created when photons are absorbed. The active region of an organic device consists of two materials, one which acts as an electron donor and the other as an acceptor. When a photon is converted into an electron hole pair, typically in the donor material, the charges tend to remain bound in the form of an exciton and are separated when the exciton diffuses to the donor-acceptor interface. The short exciton diffusion lengths of most polymer systems tend to limit the efficiency of such devices.

The performance of any type of solar battery is closely dependent on the conductivity of the electrode material and the adhesion of the electrode to the solar cell film. It has recently been proposed to use graphene and graphene oxide for the cathode and anode respectively since the two materials have appropriate work functions for the hole and the electron, respectively, and are resistant to oxidation. Adhesion of the graphene materials to the polymer films, though, still poses a problem. The polymer surface of the OPSC is hydrophobic and, hence, not amenable to any water-lift off technique for processing or plating. Spin coating is problematic since hydrophobic organic solvents sometimes used to disperse the graphene also dissolve the underlying polymer film and disturb the surface properties. Chemical vapor deposition of graphene at 1000° C. also degrades the underlying active polymer layer. Therefore, there is a need for a method for easily and economically depositing graphene on the surface of a polymer layer. There is also a need for a polymer solar cell that can generate electricity more efficiently than the polymer solar cells now being used.

SUMMARY OF THE INVENTION

In accordance with the present invention, a method of attaching reduced graphene oxide and/or graphene oxide to a polymer layer is provided. The method comprising, consisting of or consisting essentially of: forming a polymer layer having a hydrophobic, exterior surface; subjecting the hydrophobic, exterior surface of the polymer layer to ultraviolet/ozone ($UV/O_3$) exposure to change the hydrophobic, exterior surface to a hydrophilic, exterior surface; and applying reduced graphene oxide and/or graphene oxide to the hydrophilic surface of the polymer layer. The $UV/O_3$ exposure allows the reduced graphene oxide to be more easily applied to the polymer surface by reducing the contact angle of the exterior surface of the polymer layer, preferably from more than 70 degrees to less than 60 degrees and more preferably from more than 80 degrees to less than 50 degrees and most preferably from more than 90 degrees to less than 40 degrees.

The polymer layer is preferably a poly-3-hexyl thiophene ("P3HT") and phenyl-$C_{61}$-butyric acid methyl ester ("PCBM") copolymer blend ("P3HT:PCBM"). However, the polymer layer can also be polymethylmethacrylate ("PMMA") or any photoactive polymer known to produce excitons or have a photovoltaic response when exposed to the solar light spectrum. The polymer layer can be a single polymer or a multi-polymer blend with or without a charge carrier secondary component such as PCBM or graphene. The P3HT:PCBM blend has a P3HT to PCBM ratio of 20:1, more preferably 10:1 and most preferably 1:1.

The exterior surface of the polymer layer is exposed to $UV/O_3$ for a duration of from 30 seconds to one hour, preferably from 1 to 20 minutes and more preferably from 5 to 10 minutes and most preferably for 7 to 8 minutes. The UV light ranges from 100-400 nm, preferably 150-250 nm. A wavelength of 185 nm will produce approximately 0.2% ozone by weight. The dosage level is fixed by the manufacturers of the $UV/O_3$ generator and may vary from model to model. The dosage a polymer surface receives is determined in part by the contact angle with the surface. The minimum time of $UV/O_3$ exposure is the shortest time required to reduce the water contact angle on the surface of the polymer layer to approximately 60 degrees or less, more preferably 40 degrees or less, in order to make the surface hydrophilic and water processable. The exposure time can vary from polymer to polymer, depending on its degree of sensitivity to the UV/ozone radiation, which is ionizing, breaking polymer chain bonds and producing a high energy polar surface.

The reduced graphene oxide and/or graphene oxide can be in a hydrophilic solution or in a hydrophilic suspension. Preferred hydrophilic solutions comprise, consist of or consist essentially of graphene and/or graphene oxide and water, ethanol, ethanol-water mixtures, and/or dilute NaOH solutions. The preferred solution is ethanol-water. Preferred hydrophilic suspensions comprise, consist of or consist essentially of water, ethanol, ethanol-water mixtures, graphene oxide, dilute NaOH solutions and/or chlorobenzene. The preferred suspension is an alcohol-water solvent with a range of 10 vol. % to 90 vol. % alcohol and 90 vol. % to 10 vol. % $H_2O$, most preferably 25 vol. % alcohol and 75 vol. % $H_2O$. The preferred alcohol is ethanol or methanol. The hydrophilic reduced graphene oxide and/or graphene oxide solutions and suspensions preferably include gold particles, most preferably from $AuCl_4$. As used herein, all percentages of compositions are expressed as volume percent (vol. %) unless expressly identified otherwise.

The reduced graphene oxide or graphene oxide, in a solution or in a suspension, can be applied to the outer surface of the polymer layer by various coating, spray coating and electrostatic deposition methods, but the preferred method is spin coating. A thin film can also be applied to the polymer layer from the air-water interface of a Langmuir-Blodgett trough.

BRIEF DESCRIPTION OF THE FIGURES

The preferred embodiments of the method of attaching reduced graphene oxide and/or graphene oxide to a polymer layer of the present invention, as well as other objects, features and advantages of this invention, will be apparent from the accompanying drawings wherein.

DETAILED DESCRIPTION OF THE INVENTION

Figure 1:
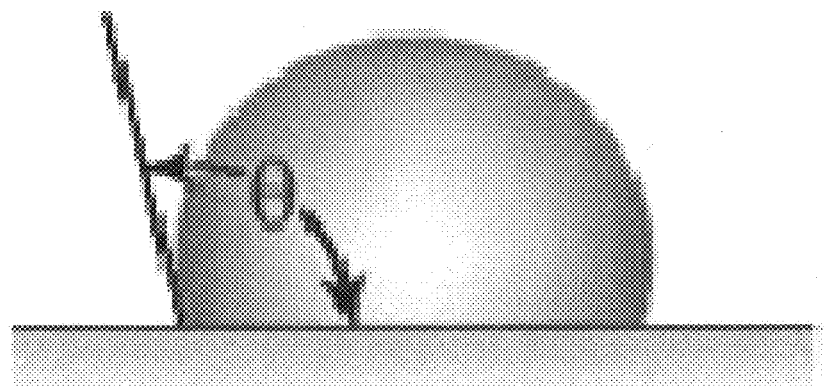
FIG. 1 shows a water droplet on a hydrophobic surface and the contact angle, $\theta$.

The present invention is a method for attaching reduced graphene oxide and/or graphene oxide to an exterior surface of a polymer layer used in a solar cell, preferably a poly-3-hexyl thiophene (P3HT) and phenyl-$C_{61}$-butyric acid methyl ester (PCBM) polymer blend (P3HT:PCBM) layer. The reduced graphene oxide coated polymer layers replace aluminum electrodes, which easily oxidize, to provide improved industrial production of longer-lasting, cost-effective solar cells.

As used herein, the terms "reduced graphene oxide" (RGO) and "chemically derived graphene" (CDG) refer to a material resulting from chemical exfoliation of graphite.

As used herein, the term "ultraviolet/ozone" ("$UV/O_3$") exposure refers to a method for altering the polymer chains on the surface of a polymer. The $UV/O_3$ exposure creates free radicals which oxidize the surface region rendering it polar and hydrophilic. The $UV/O_3$ exposure also etches the surface of the polymer and can produce roughness. Therefore, the optimal $UV/O_3$ treatment lasts for only the minimum amount of time required to etch a few nanometers and chemically oxidize the surface.

As used herein, the term "hydrophobic polymer" refers to a polymer that repels, tends not to combine with, or is incapable of dissolving in water. Characteristics of hydrophobic polymer surfaces are high contact angle with a water droplet, poor adhesiveness, poor wettability and low solid surface free energy.

As used herein, the term "hydrophilic polymer" refers to a polymer having an affinity for water and readily absorbed or dissolved in water. Generally, hydrophilic polymers are those polymers of chains of chemical compounds that have polar or charged functional groups, rendering them soluble in water. Characteristics of hydrophilic polymer surfaces are low contact angle, good adhesiveness, good wettability and high solid surface free energy.

As used herein, the term "contact angle" refers to the angle, conventionally measured through the liquid, where a liquid/vapor interface meets a solid surface. It quantifies the wettability of a solid surface by a liquid via the Young equation ($0 = \gamma_{SG} - \gamma_{SL} - \gamma_{LG} \cos \theta_C$, wherein $\gamma_{SG}$ s the solid-vapor interfacial energy, $\gamma_{SL}$ is the solid-liquid interfacial energy, $\gamma_{LG}$ is the liquid-vapor interfacial energy (i.e., the surface tension) and $\theta_C$ is the equilibrium contact angle). A given system of solid, liquid and vapor at a given temperature and pressure has a unique equilibrium contact angle. Generally, if the water contact angle is smaller than 90°, the solid surface is considered hydrophilic and if the water contact angle is larger than 90°, the solid surface is considered hydrophobic. Many polymers exhibit hydrophobic surfaces. Highly hydrophobic surfaces made of low surface energy (e.g. fluorinated) materials may have water contact angles as high as ~120°.

As used herein, the term "spin coating" refers to a procedure used to deposit uniform thin films onto flat substrates. Usually, a small amount of coating material is applied on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the viscosity and concentration of the solution and the solvent.

As used herein, the term "exciton" refers to a bound state of an electron and an electron hole, which are attracted to each other by the electrostatic Coulomb force. It is an electrically neutral quasiparticle that exists in insulators, semiconductors and in some liquids. The exciton is regarded as an elementary excitation of condensed matter that can transport energy without transporting net electric charge.

Inorganic solar cells are expensive, but organic polymer solar cells can potentially be produced at significantly lower costs. However, up until now the efficiencies of organic polymer solar cells are low (about 1-2.5%) due to donor and acceptor substances contacting the cathode and anode electrodes. This causes the recombination of the charge carriers as well as current leakage. In addition, aluminum electrodes placed on the polymer cells require evaporation under an ultra-high vacuum, and aluminum oxidizes easily, causing further degradation of the solar cell. Accordingly, the present invention replaces the aluminum electrodes with graphene.

In the present method, graphene is used to form a transparent, conducting electrode, with a work function of 4.5 eV, which is comparable to the work function of aluminum of 4.3 eV. Synthesizing reduced graphene oxide (RGO) in bulk keeps the RGO suspended in an alcohol-water solvent. However, it is still difficult to apply the RGO suspension onto the surface of a hydrophobic polymer layer. Spin coating the RGO suspension onto a polymer layer, such as a P3HT:PCBM blend layer, to form a solar cell causes the RGO to fly off with only small amounts adhering to the surface due to incompatibility of the RGO suspension and the polymer surface.

Spin coating a liquid composition is one of the most efficient methods used for coating a polymer surface. However, spin coating water-based liquids onto hydrophobic polymer surfaces results in only a small amount of the liquid adhering to the surface and is, therefore, relatively inefficient. One aspect of the present invention treats the exterior surface of a hydrophobic polymer by exposing it to UV/ozone to render the exterior surface hydrophilic and, thus, enable the deposition of graphene via a number of convenient and environmentally sustainable water processable techniques. Exposing the surfaces of hydrophobic polymers to $UV/O_3$ changes the nature of the surface from hydrophobic to hydrophilic by chemically altering the branches of the polymer chains on the surface. The hydrophilic surface is more receptive to water-based liquids and significantly increases the efficiency of spin coating methods.

In addition to spin coating, the reduced graphene oxide can be applied by first forming a thin sheet of graphene oxide and then transferring the thin sheet onto the polymer surface. One method of forming the thin film uses a Langmuir Blodgett (LB) trough, as disclosed by Kim et al., *Jpn. J. Appl. Phys.* 2003, 42, 7629. Reduced graphene oxide and/or gold nanoparticle-reduced graphene oxide solution or suspension is applied to the surface of the water on the trough after the solar cell has been submerged below the water surface. The solar cell is then pulled up by the dipper while the barriers slowly compress. This evenly deposits a film on the active layer surface of the solar cell.

Figure 2:
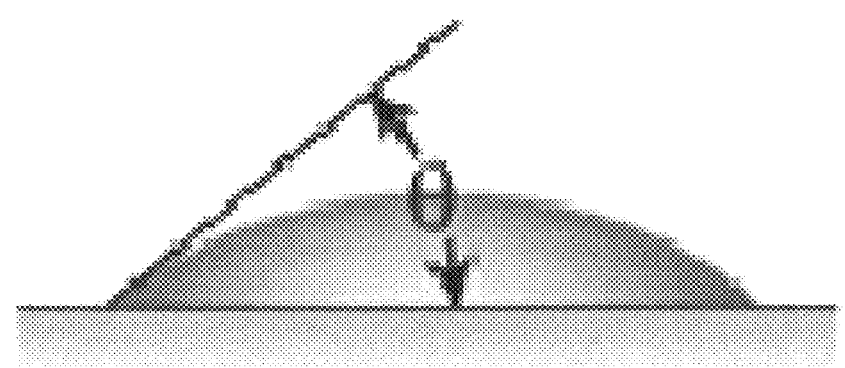
FIG. 2 shows a water droplet on a hydrophilic surface and the contact angle, $\theta$.
Figure 3:
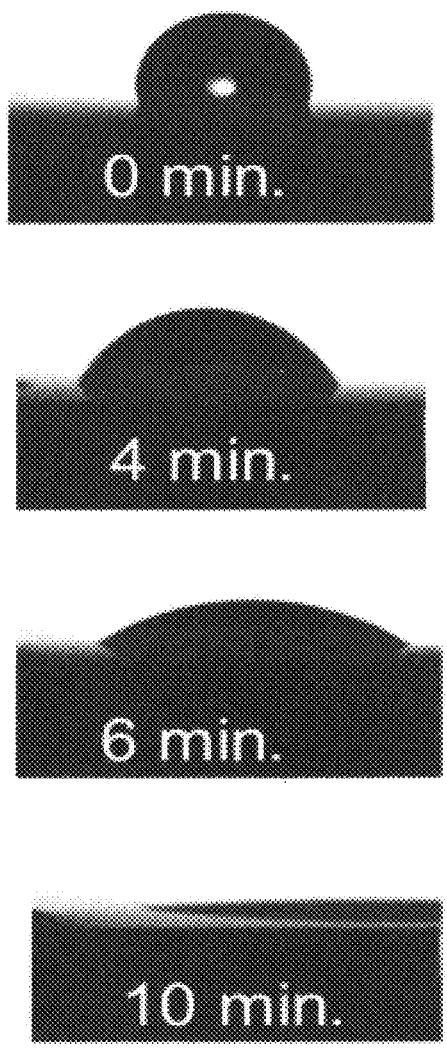
FIG. 3 shows a water droplet on a hydrophobic surface over time from 0 to 10 minutes as the surface is exposed to $UV/O_3$.

The effectiveness of the UV/ozone exposure is evidenced by the contact angle goniometry, which is a measure of the water contact angle with the surface and hence the degree of hydrophilicity. In this technique, complete wetting by water over the polymer surface is demonstrated by zero value for the contact angle, and values above 90 degrees are considered hydrophobic. See FIGS. 1 and 2, which show a water droplet on a hydrophobic surface and a water droplet on a hydrophilic surface, respectively, and the contact angle, θ. FIG. 3 illustrates how the contact angle of a water droplet on a hydrophobic thin film decreases with increasing UV/ozone exposure over time (from an untreated polymer at 0 minutes to a treated polymer at 10 minutes), completely wetting the surface after 10 minutes of exposure time.

Using the method of the present invention decreases the surface contact angle from an initial hydrophobic value of greater than 70°, preferably more than 80°, more preferably greater than 90°, and in some cases greater than 100° to a much smaller value of less than 70°, preferably less than 50° and most preferably less than 40°. After exposing the polymer surface to UV/ozone for anywhere from 30 seconds to one hour, preferably from 1 to 20 minutes, more preferably from 5 to 10 minutes and most preferably about 7 to 8 minutes, the surface can be easily wetted with the reduced graphene oxide solution. The ability to wet the polymer surface indicates that the surface has become hydrophilic.

The GO can be formed using a modified Hummers method as disclosed in U.S. Patent Pub. No. US A1 2011/0281035, which is incorporated herein in its entirety. Other well-known methods for forming GO can also be used. The GO is then suspended in an alcohol-water solvent and reduced using $NaBH_4$ as a reductant. Unreduced graphene oxide can also be used either alone or together with the reduced graphene oxide. The preferred ratio of alcohol to water in the solvent is 10 vol. % alcohol to 90 vol. % water, more preferably 25 vol. % alcohol to 75 vol. % water. Other solvents that can be used are water, ethanol, ethanol-water mixtures, and dilute NaOH solutions. Gold-nanoparticles can be added to the suspension to create a gold-nanoparticle functionalized graphene by dissolving a concentration of 0.05 mmolar $AuCl_4$ in GO suspended in 10 vol. % ethanol to 90 vol. % ethanol (preferably 50 vol. % ethanol to 50 vol. % $H_2O$, more preferably 25 vol. % ethanol to 75 vol. % water) and allow this to stir overnight. Preferably, deionized water is used. The mixture is then reduced by adding $NaBH_4$, preferably enough $NaBH_4$ is added so that the mixture has a 15 mmolar concentration $NaBH_4$. The addition of $NaBH_4$ immediately turns the solution black. The mixture is then stirred from 4 to 16 hours, preferably from 8 to 12 hours to allow an Au-graphene precipitate to form. The precipitate is dried in a vacuum oven to form a dried powder, which can be mixed with a solvent and spin cast onto a solar cell active polymer layer that has been treated with UV/ozone to make it compatible with a hydrophilic solvent. If the $NaBH_4$ reduction is not fully completed and a precipitate does not form, the solution can be used directly for spin casting onto the solar cell active polymer layer.

The polymer layer initially has a hydrophobic exterior surface and it is difficult to apply the RGO solvent or suspension to it. Preferably, the polymer is a poly-3-hexyl thiophene (P3HT) and phenyl-$C_{61}$-butyric acid methyl ester blend (P3HT:PCBM). After exposure to $UV/O_3$, the exterior surface of the polymer layer becomes hydrophilic and the RGO solvent or suspension readily adheres to the surface. Tests showed that spin coating the RGO suspension onto the $UV/O_3$ modified polymer surface caused increased adhesion to the point where longer spinning time was required to evaporate the solvent from the surface.

The ultraviolet/ozone ($UV/O_3$) exposure can be provided by different $UV/O_3$ generators that are well known to those skilled in the art and commercially available. For example, ultraviolet lamps are frequently used to generate ozone. A UV lamp emits UV light at 185 nanometers (nm). Air (usually ambient air) is passed over an ultraviolet lamp, which splits oxygen ($O_2$) molecules in the gas. The resulting oxygen atoms ($O^-$), seeking stability, attach to other oxygen molecules ($O_2$), forming ozone ($O_3$). The polymer surface is exposed to the ozone for a time sufficient to change the exterior surface from hydrophobic to hydrophilic. Longer exposure and greater concentrations of $O_3$ result in the polymer surface becoming more hydrophilic.

EXAMPLES

The examples set forth below serve to provide further appreciation of the invention but are not meant in any way to restrict the scope of the invention.

Example 1

Two polymer layers with a hydrophobic exterior surface were formed from a P3HT:PCBM polymer blend. A reduced graphene oxide suspension was applied by spin coating to the first layer. Tests showed that a contact angle of water on the exterior surface of the P3HT:PCBM layer was about 100 degrees. After UV/ozone exposure for seven minutes, a reduced graphene oxide suspension was applied by spin coating to the second layer. The contact angle of water was measured and found to be 38 degrees. Thus, as a result of the UV/$O_3$ exposure, the contact angle on the surface of the polymer layer was decreased from about 100 degrees to 38 degrees.

Figure 4:
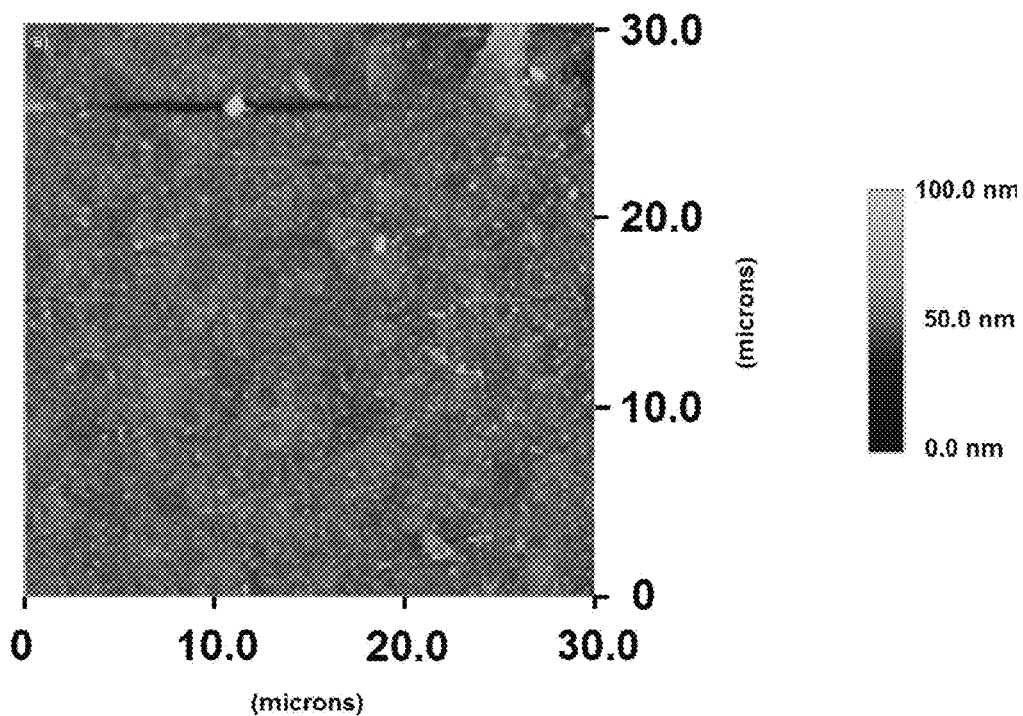
FIG. 4 is an atomic force microscope ("AFM") image of a polymer layer prior to UV/ozone exposure.
Figure 5:
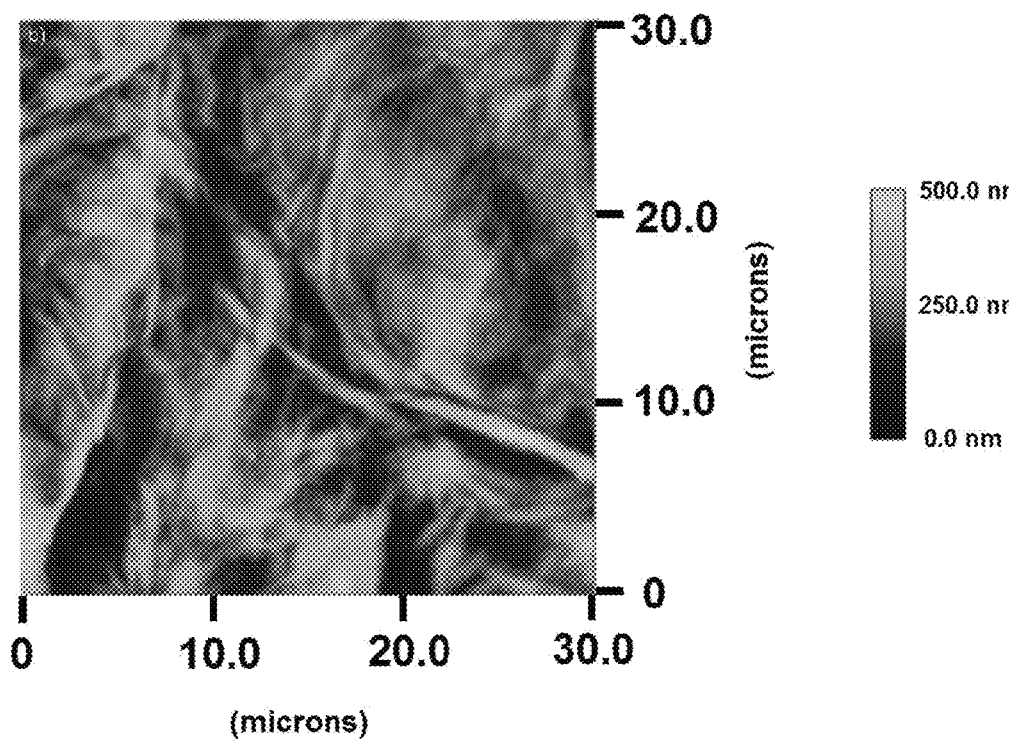
FIG. 5 is an atomic force microscope image of a polymer layer after UV/ozone exposure and the application of reduced graphene oxide by spin coating.

After the RGO was applied to the two layers by spin coating, images of the two surfaces were taken using an atomic force microscope ("AFM") as shown in FIGS. 4-5. FIG. 4 shows very little graphene adhering to the polymer without first treating the surface with UV/ozone exposure. FIG. 5 shows a layer of graphene visibly adheres to the P3HT:PCBM layer after UV/ozone exposure.

Example 2

0.05 mmolar of $AuCl_4$ was stirred in graphene oxide in a 25% ethanol/75% $H_2O$ solvent overnight and then reduced with 15 mmolar NaBH4. This produced gold-naoparticle-studded graphene sheets that were characterized by transmission electron microscopy ("TEM") and Fourier transform infrared spectroscopy ("FTIR"). These gold-graphene sheets were incorporated into the active layer of an organic polymer solar cell and they were found to enhance the efficiency significantly increase the performance of the organic polymer solar cell.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. A method of attaching reduced graphene oxide and/or graphene oxide to a polymer layer, the method comprising:
   forming a polymer layer having an exterior surface, wherein the exterior surface is hydrophobic;
   subjecting the hydrophobic, exterior surface of the polymer layer to ultraviolet/ozone (UV/$O_3$) exposure, wherein the UV/$O_3$ exposure changes the hydrophobic, exterior surface to a hydrophilic, exterior surface and etches the exterior surface; and
   applying a reduced graphene oxide and/or graphene oxide solution or suspension to the hydrophilic surface of the polymer layer.

2. The method of attaching reduced graphene oxide and/or graphene oxide to a polymer layer according to claim 1, wherein the polymer layer is a poly-3-hexyl thiophene (P3HT) and phenyl-$C_{61}$-butyric acid methyl ester (PCBM) blend (P3HT:PCBM).

3. The method of attaching reduced graphene oxide and/or graphene oxide to a polymer layer according to claim 1, wherein the UV/$O_3$ exposure has a duration of from 1 to 20 minutes.

4. The method of attaching reduced graphene oxide and/or graphene oxide to a polymer layer according to claim 1, wherein the UV/$O_3$ exposure has a duration of from 5 to 10 minutes.

5. The method of attaching reduced graphene oxide to a polymer layer according to claim 1, wherein the exterior surface of the polymer layer has a contact angle, and wherein the contact angle is reduced from more than 70 degrees to less than 70 degrees by the UV/$O_3$ exposure.

6. The method of attaching reduced graphene oxide and/or graphene oxide to a polymer layer according to claim 1, wherein the exterior surface of the polymer layer has a contact angle, and wherein the contact angle is reduced from more than 80 degrees to less than 50 degrees by the UV/$O_3$ exposure.

7. The method of attaching reduced graphene oxide and/or graphene oxide to a polymer layer according to claim 1, wherein the reduced graphene oxide and/or graphene oxide comprises gold particles.

8. The method of attaching reduced graphene oxide to a polymer layer according to claim 1, wherein the reduced graphene oxide and/or graphene oxide solution or suspensions comprises gold particles derived from $AuCl_4$.

9. The method of attaching reduced graphene oxide and/or graphene oxide to a polymer layer according to claim 1, wherein UV/$O_3$ exposure is for a period of from thirty seconds to one hour.

10. The method of attaching reduced graphene oxide and/or graphene oxide to a polymer layer according to claim 1, wherein the reduced graphene oxide and/or graphene oxide is in a hydrophilic suspension or in a hydrophilic solution.

11. The method of attaching reduced graphene oxide and/or graphene oxide to a polymer layer according to claim 1, wherein the reduced graphene oxide and/or graphene oxide is applied by spin coating or by applying a thin film from the air-water interface of a Langmuir-Blodgett trough.

12. A method of attaching reduced graphene oxide and/or graphene oxide to a polymer layer, the method comprising:
   forming a poly-3-hexyl thiophene (P3HT) and phenyl-$C_{61}$-butyric acid methyl ester (PCBM) blend polymer layer (P3HT:PCBM) having an exterior surface, wherein the exterior surface is hydrophobic;
   subjecting the hydrophobic, exterior surface of the P3HT:PCBM blend polymer layer to ultraviolet/ozone (UV/$O_3$) exposure, wherein the UV/$O_3$ exposure changes the hydrophobic, exterior surface to a hydrophilic, exterior surface and etches the exterior surface; and
   applying a hydrophilic suspension or a hydrophilic solvent comprising reduced graphene oxide and/or graphene oxide to the hydrophilic surface of the P3HT:PCBM blend polymerlayer.

13. The method of attaching reduced graphene oxide and/or graphene oxide to a polymer layer according to claim 12, wherein the duration of the UV/$O_3$ exposure is from 1 to 20 minutes.

14. The method of attaching reduced graphene oxide and/or graphene oxide to a polymer layer according to claim 12, wherein the exterior surface of the polymer layer has a contact angle, and wherein the contact angle of the exterior surface of the polymer layer is reduced from more than 80 degrees to less than 40 degrees by the UV/$O_3$ exposure.

15. The method of attaching reduced graphene oxide and/or graphene oxide to a polymer layer according to claim 12, wherein the hydrophilic suspension or hydrophilic solvent of reduced graphene oxide and/or graphene oxide comprises gold particles.

16. The method of attaching reduced graphene oxide and/or graphene oxide to a polymer layer according to claim 12, wherein the hydrophilic suspension or hydrophilic solvent of reduced graphene oxide and/or graphene oxide comprises gold particles derived from $AuCl_4$.

17. The method of attaching reduced graphene oxide and/or graphene oxide to a polymer layer according to claim 12, wherein the hydrophilic suspension or hydrophilic solvent of reduced graphene oxide and/or graphene oxide is applied by spin coating or by applying a thin film from the air-water interface of a Langmuir-Blodgett trough.

18. A method of attaching reduced graphene oxide and/or graphene oxide to a poly-3-hexyl thiophene (P3HT) and phenyl-C$_{61}$-butyric acid methyl ester (PCBM) blend polymer layer (P3HT:PCBM), the method comprising:
- forming a P3HT:PCBM blend polymer layer having an exterior surface, wherein the exterior surface is hydrophobic and has a contact angle;
- subjecting the hydrophobic, exterior surface of the P3HT:PCBM blend polymer layer to ultraviolet/ozone (UV/O$_3$) exposure for a duration of from 30 seconds to one hour, wherein the UV/O$_3$ exposure changes the hydrophobic, exterior surface to a hydrophilic, exterior surface and etches the exterior surface; and
- applying a hydrophilic suspension or a hydrophilic solvent comprising reduced graphene oxide and/or graphene oxide and gold particles to the hydrophobic surface of the P3HT:PCBM blend polymer layer, wherein the UV/O$_3$ exposure reduces the contact angle of the exterior surface of the P3HT:PCBM blend polymer layer from more than 80 degrees to less than 50 degrees.

19. The method of attaching reduced graphene oxide and/or graphene oxide to a P3HT:PCBM blend polymer layer according to claim 18, wherein the gold particles are derived from AuCl$_4$.

20. The method of attaching reduced graphene oxide and/or graphene oxide to a P3HT:PCBM blend polymer layer according to claim 18, wherein the hydrophilic suspension of reduced graphene oxide and/or graphene oxide is applied by spin coating or by applying a thin film from the air-water interface of a Langmuir-Blodgett trough.

* * * * *